(12) United States Patent
Lu et al.

(10) Patent No.: US 7,666,714 B2
(45) Date of Patent: Feb. 23, 2010

(54) ASSEMBLY OF THIN DIE CORELESS PACKAGE

(75) Inventors: Daoqiang Lu, Chandler, AZ (US);
Rajashree Baskaran, Seattle, WA (US);
Charan Gurumurthy, Higley, AZ (US)

(73) Assignee: Intel Corporation, Santa Clara, CA (US)

( * ) Notice: Subject to any disclaimer, the term of this patent is extended or adjusted under 35 U.S.C. 154(b) by 476 days.

(21) Appl. No.: 11/648,120

(22) Filed: Dec. 29, 2006

(65) Prior Publication Data

US 2008/0160673 A1    Jul. 3, 2008

(51) Int. Cl.
*H01L 21/58* (2006.01)
(52) U.S. Cl. ............... 438/122; 257/718; 257/E23.083; 257/E21.505
(58) Field of Classification Search .................. 438/122; 257/718, E23.083, E21.505
See application file for complete search history.

(56) References Cited

U.S. PATENT DOCUMENTS

| 4,829,663 | A * | 5/1989 | Masujima et al. ............. 29/840 |
| 5,988,485 | A * | 11/1999 | Master et al. .......... 228/180.22 |
| 2005/0000634 | A1* | 1/2005 | Craig et al. .................. 156/230 |
| 2006/0060637 | A1* | 3/2006 | Susheel et al. .............. 228/207 |
| 2008/0057625 | A1* | 3/2008 | Chan et al. .................. 438/113 |

* cited by examiner

*Primary Examiner*—David Vu
*Assistant Examiner*—Earl N Taylor
(74) *Attorney, Agent, or Firm*—Caven & Aghevli LLC

(57) ABSTRACT

In one embodiment, a method comprises coupling a coreless substrate panel to a pressure cover plate of a carrier, applying flux to the coreless substrate panel, placing at least one die on the coreless substrate panel, reflowing solder onto the coreless substrate panel, defluxing the coreless substrate panel, underfilling the coreless substrate panel, and attaching at least one heat spreader to the coreless substrate panel.

4 Claims, 5 Drawing Sheets

ASSEMBLY OF THIN DIE CORELESS PACKAGE

BACKGROUND

The subject matter described herein relates to the assembly of thin die coreless packages.

Electronic components, including integrated circuits, may be assembled into component packages by physically and electrically coupling them to a substrate. Thin dies exhibit performance advantages in some circumstances. Hence, techniques for the assembly of thin die packages find utility.

BRIEF DESCRIPTION OF THE DRAWINGS

The detailed description is described with reference to the accompanying figures.

DETAILED DESCRIPTION

Described herein are techniques for assembly of thin die coreless packages for integrated circuits. In the following description, numerous specific details are set forth to provide a thorough understanding of various embodiments. However, it will be understood by those skilled in the art that the various embodiments may be practiced without the specific details. In other instances, well-known methods, procedures, components, and circuits have not been illustrated or described in detail so as not to obscure the particular embodiments.

Figure 1:
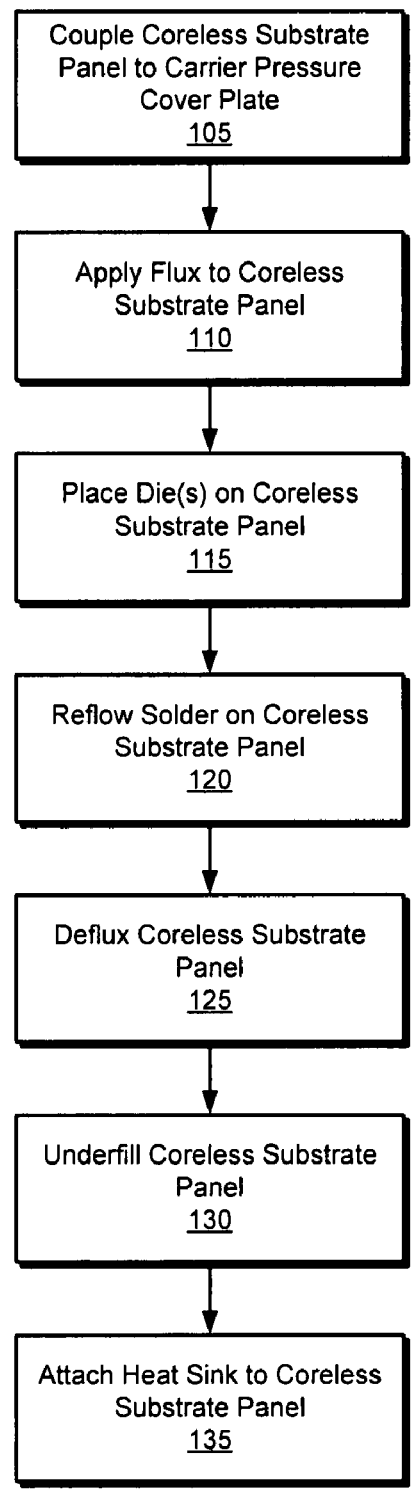
FIG. 1 is a flowchart illustrating operations in an embodiment of a method for assembly of thin die coreless IC packages.
Figure 2A:
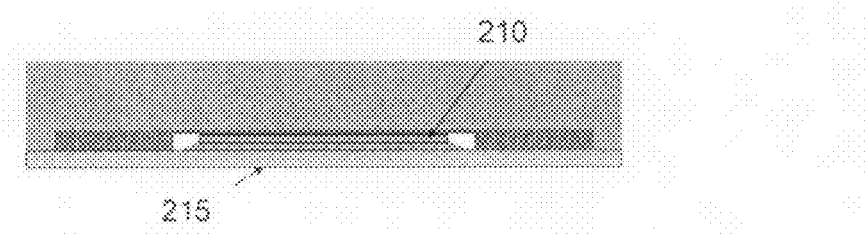
FIG. 2A is a schematic illustration of an embodiment of a thin die coreless IC package.
Figure 2B:
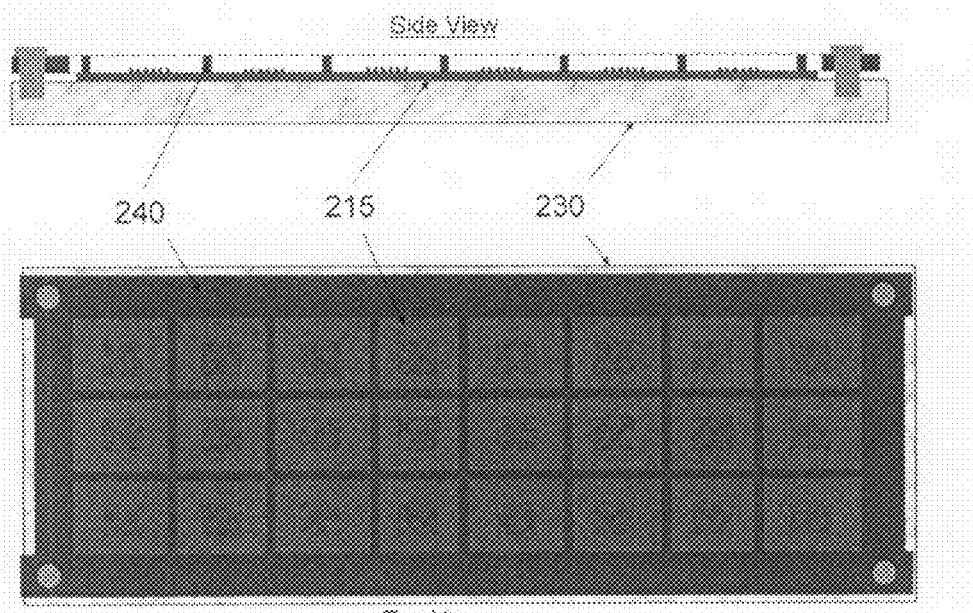
FIGS. 2B-2D are schematic illustrations of an embodiment of a thin die coreless IC package during an assembly process.
Figure 2C:
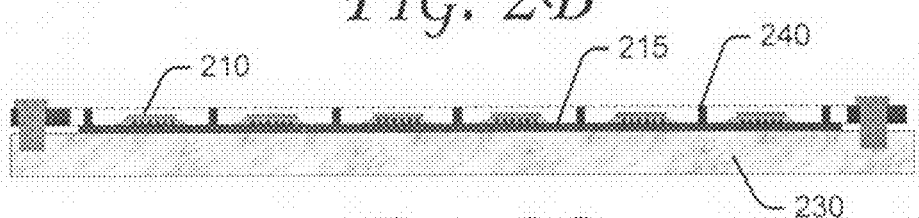
Figure 2D:
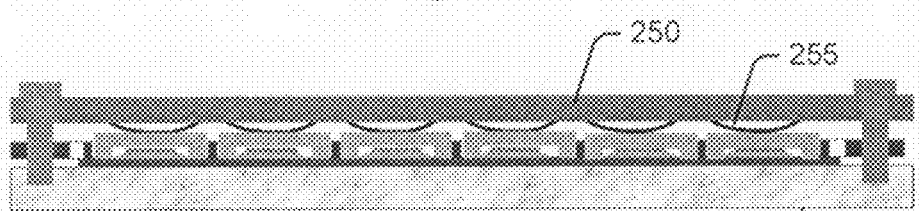

One embodiment of techniques for assembly of thin die coreless packages for integrated circuits will be described with reference to FIG. 1 and FIGS. 2A-2D. FIG. 1 is a flowchart illustrating operations in an embodiment of a method for assembly of thin die coreless integrated circuit (IC packages). FIG. 2A is a schematic illustration of an embodiment of a thin die coreless IC package. FIGS. 2B-2D are schematic illustrations of an embodiment of a thin die coreless IC package during an assembly process.

Referring first to FIG. 2A, in some embodiments a thin die coreless (TDCL) package architecture may comprise a thin die 210, a coreless substrate 215, a heat spreader, and a thermal interface material (TIM). In some embodiments, a coreless substrate may be obtained in panel form. Extra space may be provided between adjacent substrates. A substrate carrier 230 is provided. In some embodiments the substrate carrier 230 may be designed and fabricated. In the embodiment depicted in FIG. 2B, the substrate carrier 230 has a flat base and a pressure cover plate 240. The cover plate 240 includes a grid which will be pressed against the space between adjacent substrates to flatten the coreless substrates.

Referring to FIG. 1, at operation 105 a coreless substrate 215 is coupled to a pressure cover plate 240 of a substrate carrier 230. In some embodiments, the coreless substrate 215 may be in panel form. In some embodiments, the coreless substrate 215 provides a space between two or more adjacent substrates. In some embodiments, the carrier 230 comprises a flat base and a pressure cover plate, and the pressure cover plate 240 comprises a fine grid, which is pressed against space between adjacent substrates.

At operation 110 flux is applied to the coreless substrate panel 215. At operation 115 at least one die (210) is placed on the coreless substrate panel 215 (FIG. 2C). At operation 120 solder is reflowed onto the coreless substrate panel 215 (FIG. 2C). At operation 125 the coreless substrate panel 215 is defluxed (FIG. 2C). At operation 130 the coreless substrate panel 215 is underfilled.

At operation 135 at least one heat spreader 250 is attached to the coreless substrate panel (FIG. 2D). In some embodiments, attaching at least one heat spreader 250 to the coreless substrate panel 215 may include attaching one or more pressure clips 255 to apply bonding pressure to the heat spreader 250. The assembled chip packages may then be separated.

Figure 3:
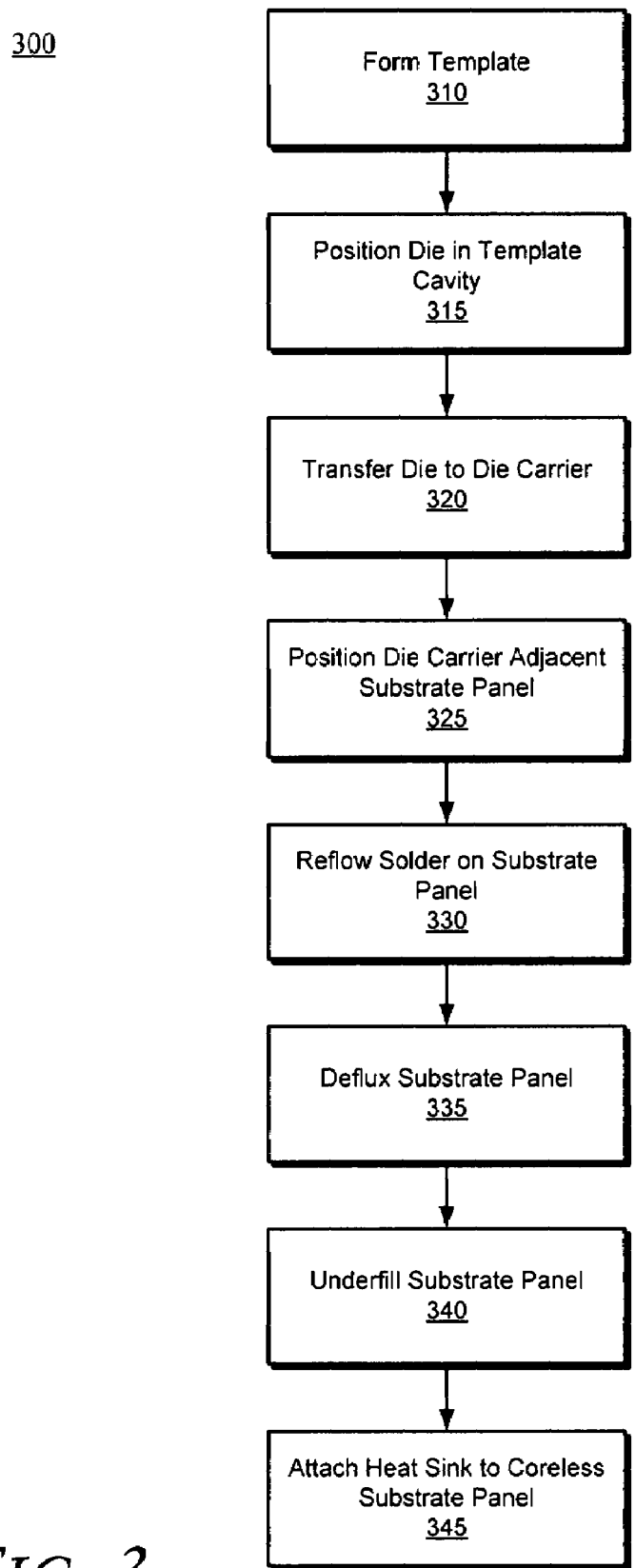
FIG. 3 is a flowchart illustrating operations in an embodiment of a method for assembly of thin die coreless IC packages.
Figure 4A:
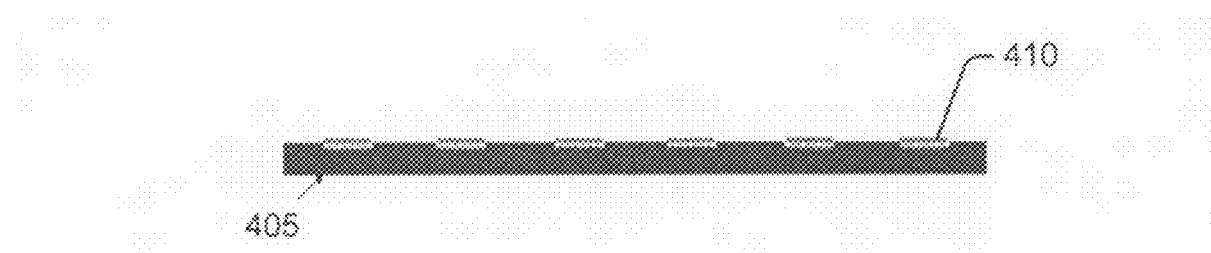
FIGS. 4A-4E are schematic illustrations of an embodiment of a thin die coreless IC package during an assembly process.

Another embodiment of techniques for assembly of thin die coreless packages for integrated circuits will be described with reference to FIG. 3 and FIGS. 4A-4E. FIG. 3 is a flowchart illustrating operations in an embodiment of a method for assembly of thin die coreless IC packages. FIG. 4A is a schematic illustration of an embodiment of a template for use in a thin die coreless IC package. FIGS. 4B-4E are schematic illustrations of an embodiment of a thin die coreless IC package during an assembly process.

Referring to FIG. 3, at operation 310 a template is formed. In some embodiments a template 405 may be fabricated with one or more shallow cavities for holding the dies 410. The dimensions and location of the cavities may be controlled with high precision. The template may comprise silicon. At operation 315 a die is positioned in at least one cavity of the template 405. In some embodiments all dies are positioned in the cavities of the template 405.

Figure 4B:
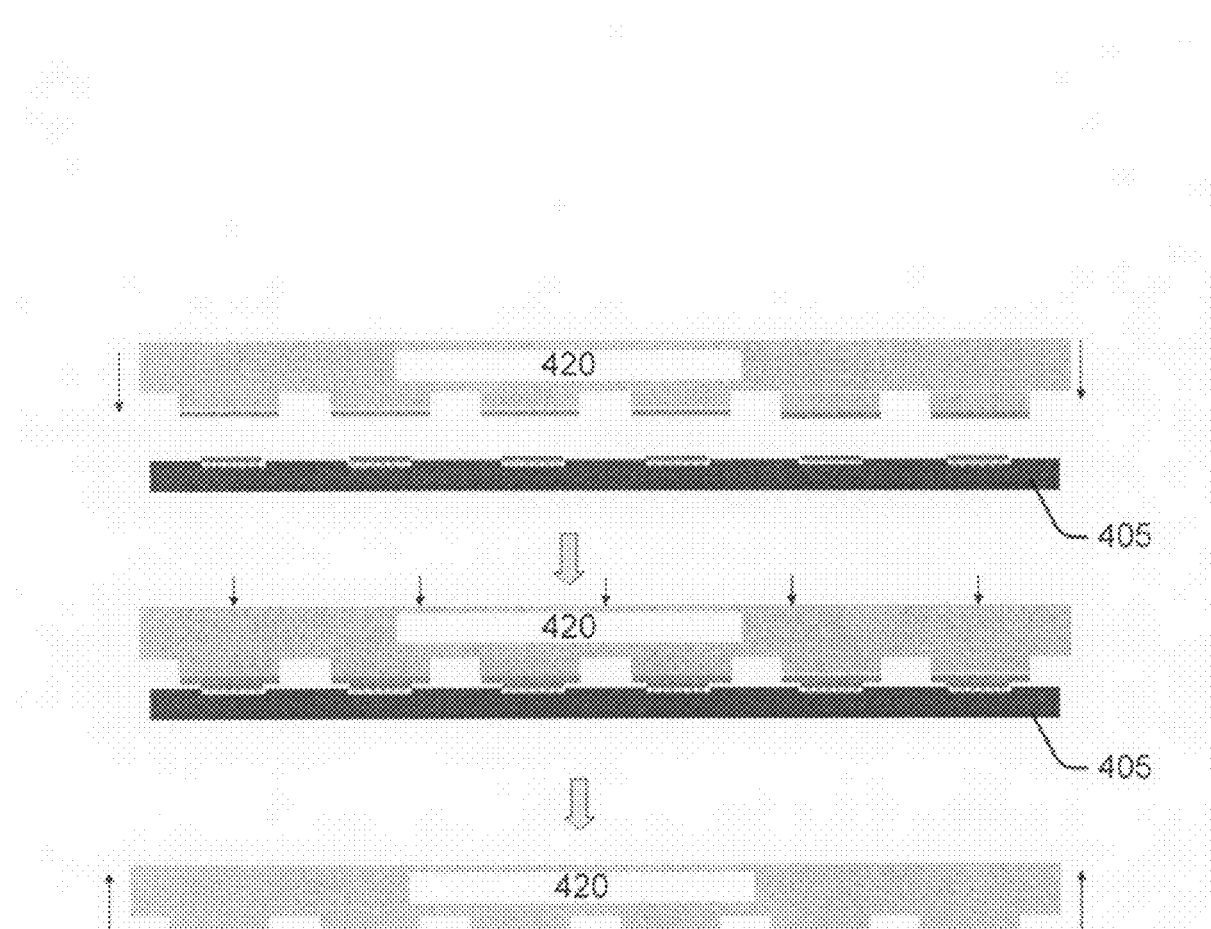
Figure 4C:
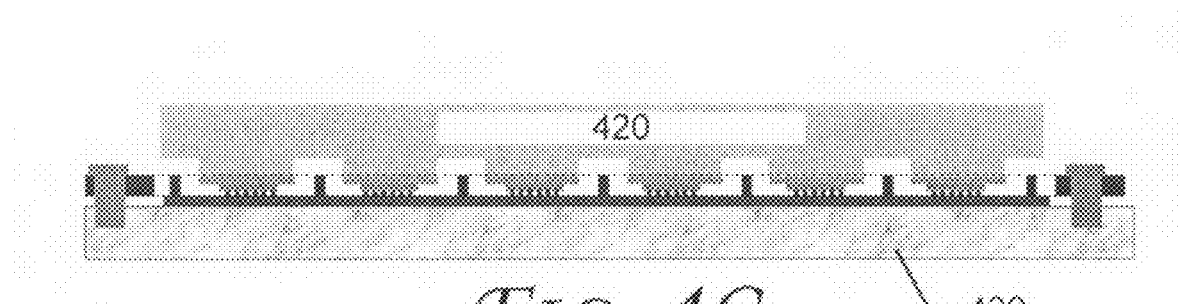

At operation 320 the die(s) are transferred to a die carrier 420. In some embodiments transferring the die(s) to a die carrier comprises coating the die carrier with a layer of a high temperature silicone-based tacky material and contacting the die carrier to the template (FIG. 4B). At operation 325 the die carrier 420 is positioned adjacent a substrate panel having printed flux thereon (FIG. 4B). The substrate panel may be positioned with a carrier 430 (FIG. 4C). In some embodiments carrier 430 comprises a flat base and a pressure cover plate, which may comprise a grid which is pressed against space between adjacent substrates.

Figure 4D:

At operation 330 solder is reflowed onto the coreless substrate panel 215 (FIG. 4D). At operation 335 the coreless substrate panel is defluxed (FIG. 4D). At operation 340 the coreless substrate panel is underfilled (FIG. 4D).

Figure 4E:
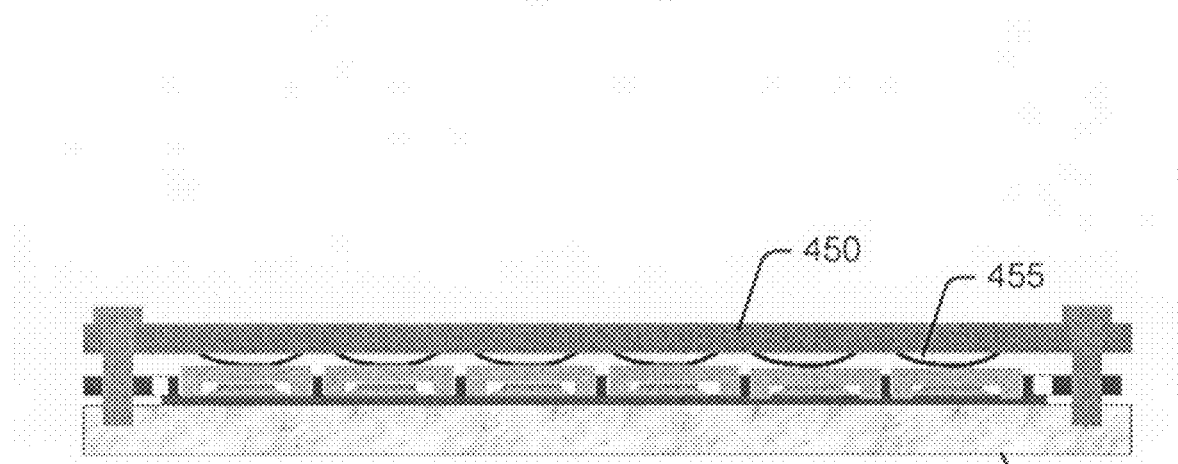

At operation 345 at least one heat spreader 450 is attached to the coreless substrate panel (FIG. 4E). In some embodiments, attaching at least one heat spreader 450 to the coreless substrate panel 415 may include attaching one or more pressure clips 455 to apply bonding pressure to the heat spreader 450. The assembled chip packages may then be separated.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" "some embodiments" or "an embodiment" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A method, comprising:
   coupling a coreless substrate panel to a pressure cover plate of a carrier; and
   applying flux to the coreless substrate panel;
   placing at least one die on the coreless substrate panel;
   reflowing solder onto the coreless substrate panel;
   defluxing the coreless substrate panel;
   underfilling the coreless substrate panel between the die and the coreless substrate panel; and
   attaching at least one heat spreader to the coreless substrate panel, wherein the carrier comprises a flat base and the pressure cover plate comprises a fine grid, and is pressed against space between adjacent substrates.

2. The method of claim 1, wherein attaching at least one heat spreader to the coreless substrate panel comprises attaching one or more pressure clips to apply bonding pressure to the heat spreader.

3. A method, comprising:
   forming a template which comprises at least one cavity for holding a die;
   positioning a die in at least one cavity of the template;
   transferring the die from the template to a die carrier;
   positioning the die carrier adjacent a substrate panel having printed flux;
   reflowing solder on the substrate panel;
   detaching the die carrier from the die;
   defluxing the substrate panel;
   underfilling the substrate panel between the die and the coreless substrate panel; and
   attaching at least one heat spreader to the substrate panel, wherein the carrier comprises a flat base and the pressure cover plate comprises a fine grid, and is pressed against space between adjacent substrates.

4. The method of claim 3, wherein attaching at least one heat spreader to the substrate panel comprises attaching one or more pressure clips to apply bonding pressure to the heat spreader.

* * * * *

UNITED STATES PATENT AND TRADEMARK OFFICE
CERTIFICATE OF CORRECTION

PATENT NO. : 7,666,714 B2 Page 1 of 1
APPLICATION NO. : 11/648120
DATED : February 23, 2010
INVENTOR(S) : Lu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 532 days.

Signed and Sealed this

Twenty-eighth Day of December, 2010

David J. Kappos
*Director of the United States Patent and Trademark Office*